(12) United States Patent
Du et al.

(10) Patent No.: US 9,646,888 B2
(45) Date of Patent: May 9, 2017

(54) TECHNIQUE OF REDUCING SHALLOW TRENCH ISOLATION LOSS DURING FIN FORMATION IN FINFETS

(71) Applicant: SEMICONDUCTOR MANUFACTURING INTERNATIONAL (SHANGHAI) CORPORATION, Shanghai (CN)

(72) Inventors: Lijuan Du, Shanghai (CN); Hai Zhao, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/991,184

(22) Filed: Jan. 8, 2016

(65) Prior Publication Data
US 2016/0218041 A1 Jul. 28, 2016

(30) Foreign Application Priority Data
Jan. 22, 2015 (CN) .......................... 2015 1 0033538

(51) Int. Cl.
| | |
|---|---|
| H01L 21/82 | (2006.01) |
| H01L 21/8234 | (2006.01) |
| H01L 29/66 | (2006.01) |
| H01L 21/762 | (2006.01) |
| H01L 21/311 | (2006.01) |

(Continued)

(52) U.S. Cl.
CPC .. *H01L 21/823481* (2013.01); *H01L 21/0332* (2013.01); *H01L 21/31111* (2013.01); *H01L 21/31116* (2013.01); *H01L 21/31155* (2013.01); *H01L 21/76237* (2013.01); *H01L 21/823431* (2013.01); *H01L 27/0886* (2013.01); *H01L 29/66795* (2013.01); *H01L 29/785* (2013.01)

(58) Field of Classification Search
CPC ....... H01L 21/823481; H01L 21/31111; H01L 29/785; H01L 27/0886; H01L 21/31116; H01L 29/66795; H01L 29/0653; H01L 21/823412; H01L 21/823431; H01L 21/265; H01L 21/76237; H01L 21/0332; H01L 21/324
See application file for complete search history.

(56) References Cited

U.S. PATENT DOCUMENTS

2015/0048453 A1* 2/2015 Ching ................. H01L 29/7856
257/347

* cited by examiner

*Primary Examiner* — Roy Potter
*Assistant Examiner* — Paul Patton
(74) *Attorney, Agent, or Firm* — Kilpatrick Townsend and Stockton LLP

(57) ABSTRACT

A method of fabricating a semiconductor device includes: providing a semiconductor substrate including a hard mask layer; performing, using the hard mask layer, etching to the semiconductor substrate to form a fin-type structure and a groove; forming an isolation material layer in the regions between adjacent fins of the fin-type structure and in the groove; removing a portion of the isolation material layer that is located above the hard mask layer to form a shallow trench isolation; and forming a second mask layer over the hard mask layer, the second mask layer having an opening above the shallow trench isolation; performing ion implantation to the shallow trench isolation through the opening; removing the second mask layer and the hard mask layer; and removing a portion of the isolation material layer located in the regions between adjacent fins of the fin-type structure and a portion of the shallow trench isolation.

9 Claims, 5 Drawing Sheets

(51) Int. Cl.
*H01L 21/033* (2006.01)
*H01L 29/78* (2006.01)
*H01L 27/088* (2006.01)
*H01L 21/3115* (2006.01)

TECHNIQUE OF REDUCING SHALLOW TRENCH ISOLATION LOSS DURING FIN FORMATION IN FINFETS

CROSS-REFERENCES TO RELATED APPLICATIONS

This application claims priority to Chinese patent application No. 201510033538.7, filed on Jan. 22, 2015, the content of which is incorporated herein by reference in its entirety.

BACKGROUND OF THE INVENTION

The present invention relates to the field of semiconductor technology, and particularly relates to a method of forming a semiconductor device.

In the field of semiconductor technology, fin-type field effect transistors (FinFET) have been widely used due to their advantages. Fin-type field effect transistors not only have suppressed short-channel effects (SCE), but also have many other advantages. For example, they may be formed by using a self-aligned double patterning (SADP) technology.

However, in the conventional processes of forming a fin-type field effect transistor, during the process of etching the dielectric layer (the isolation material layer) located near the fin-type structure to form the recesses, because of etching selectivity ratio problems, the shallow trench isolation in the fin cut area (the area near the fin-type structure where the etching is performed) is often subject to excessive etching. This phenomenon will affect device performance and reliability.

SUMMARY OF THE INVENTION

In an embodiment of the present invention, a method of fabricating a semiconductor device is provided. The method includes: providing a semiconductor substrate including a hard mask layer formed thereon; performing, using the hard mask layer, etching to the semiconductor substrate to form a fin-type structure and a groove, the fin-type structure including a plurality of fins; forming an isolation material layer in the regions between adjacent fins of the fin-type structure and in the groove; removing by chemical mechanical polishing (CMP) a portion of the isolation material layer that is located above the hard mask layer to form a shallow trench isolation; and forming a second mask layer over the hard mask layer, the second mask layer having an opening above the shallow trench isolation; performing ion implantation to the shallow trench isolation through the opening; removing the second mask layer and the hard mask layer; and removing by etching a portion of the isolation material layer located in the regions between adjacent fins of the fin-type structure and a portion of the shallow trench isolation.

According to an embodiment, the method further includes: after removing the second mask layer and the hard mask layer, and before removing a portion of the isolation material layer located in the regions between adjacent fins of the fin-type structure and a portion of the shallow trench isolation, performing annealing to the shallow trench isolation.

According to an embodiment, performing ion implantation uses carbon ions.

According to an embodiment, an injecting direction of the ion implantation is substantially perpendicular to an upper surface of the semiconductor substrate.

According to an embodiment, the hard mask layer includes a first silicon oxide layer, a silicon nitride layer, and a second silicon oxide layer.

According to an embodiment, the method further includes, before forming the isolation material layer, forming a liner material layer; and removing by CMP a portion of the isolation material layer that is located above the hard mask layer includes removing by CMP a portion of the liner material layer that is located above the hard mask layer.

According to an embodiment, performing etching to the semiconductor substrate to form a fin-type structure and a groove uses a self-aligned double patterning technique.

According to an embodiment, the isolation material layer includes silicon oxide; and the isolation material layer is formed by fluid chemical vapor deposition.

According to an embodiment, the second mask layer includes a photoresist layer.

In another embodiment of the present invention, an electronic apparatus is provided. The electronic apparatus includes a semiconductor device, and an electronic component assembly coupled to the semiconductor device. The semiconductor device is formed by: providing a semiconductor substrate including a hard mask layer formed thereon; performing, using the hard mask layer, etching to the semiconductor substrate to form a fin-type structure and a groove, the fin-type structure including a plurality of fins; forming an isolation material layer in the regions between adjacent fins of the fin-type structure and in the groove; removing by chemical mechanical polishing (CMP) a portion of the isolation material layer that is located above the hard mask layer to form a shallow trench isolation; forming a second mask layer over the hard mask layer, the second mask layer having an opening above the shallow trench isolation; performing ion implantation to the shallow trench isolation through the opening; removing the second mask layer and the hard mask layer; and removing by etching a portion of the isolation material layer located in the regions between adjacent fins of the fin-type structure and a portion of the shallow trench isolation.

According to an embodiment, the semiconductor device is further formed by: after removing the second mask layer and the hard mask layer, and before removing a portion of the isolation material layer located in the regions between adjacent fins of the fin-type structure and a portion of the shallow trench isolation, performing annealing to the shallow trench isolation.

According to an embodiment, performing ion implantation uses carbon ions.

According to an embodiment, an injecting direction of the ion implantation is substantially perpendicular to an upper surface of the semiconductor substrate.

DETAILED DESCRIPTION OF THE INVENTION

Figure 1A:
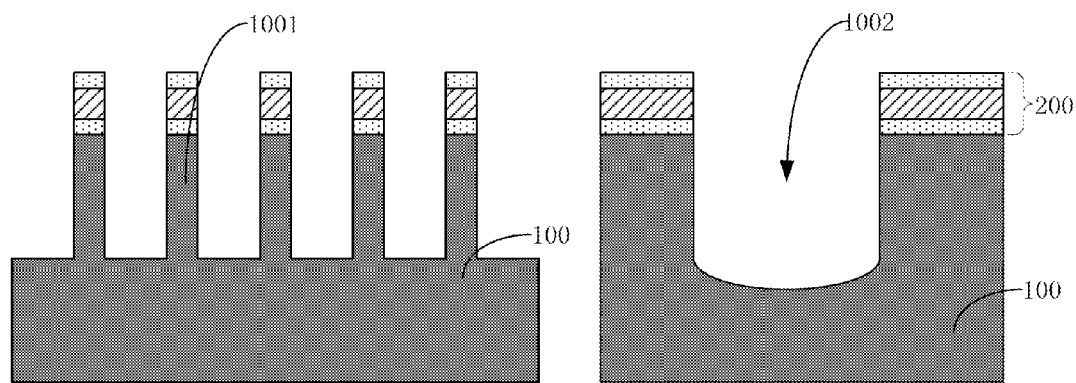
FIGS. 1A-1H show schematic cross-sectional views of a structure illustrating the intermediate steps of a method of forming a semiconductor device according to an embodiment of the present invention.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein, but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc., do not denote any order, but rather the terms first, second, etc., are used to distinguish one element from another. Furthermore, the use of the terms a, an, etc., does not denote a limitation of quantity, but rather denote the presence of at least one of the referenced items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein, but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully hereinafter with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

First Embodiment

An embodiment of the present invention provides a method of forming a semiconductor device. FIGS. 1A to 1H show schematic cross-sectional views of a structure illustrating the intermediate steps of a method of forming a semiconductor device according to an embodiment of the present invention. FIG. 2 is a simplified flowchart illustrating a method of forming a semiconductor device according to an embodiment of the present invention.

The method includes, at step A1, providing a semiconductor substrate 100. The semiconductor substrate includes a hard mask (HM) layer 200 formed thereon. Step A1 further includes, using the hard mask layer 200, etching the semiconductor substrate 100 to form a fin-type structure 1001 and a groove 1002 for receiving a shallow trench isolation, the fin-type structure includes a plurality of fins, as shown in FIG. 1A.

According to an embodiment, a self-aligned double patterning (SADP) technology is used to form the fin-type structure 1001 and the groove 1002. By using the self-aligned double patterning technology, one can ensure that the fin-type structure 1001 has better morphology.

The hard mask layer 200 may have a single layer structure, or a multilayer structure. In one embodiment, the hard mask layer 200 has a three-layer structure that includes, from top to bottom, a first silicon oxide layer, a silicon nitride layer, and a second silicon oxide layer.

Figure 1B:
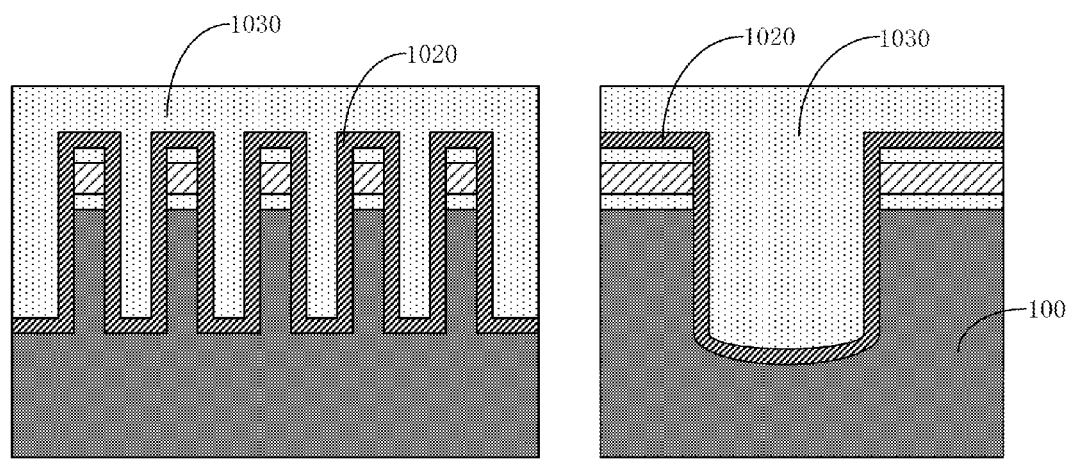
Figure 2:
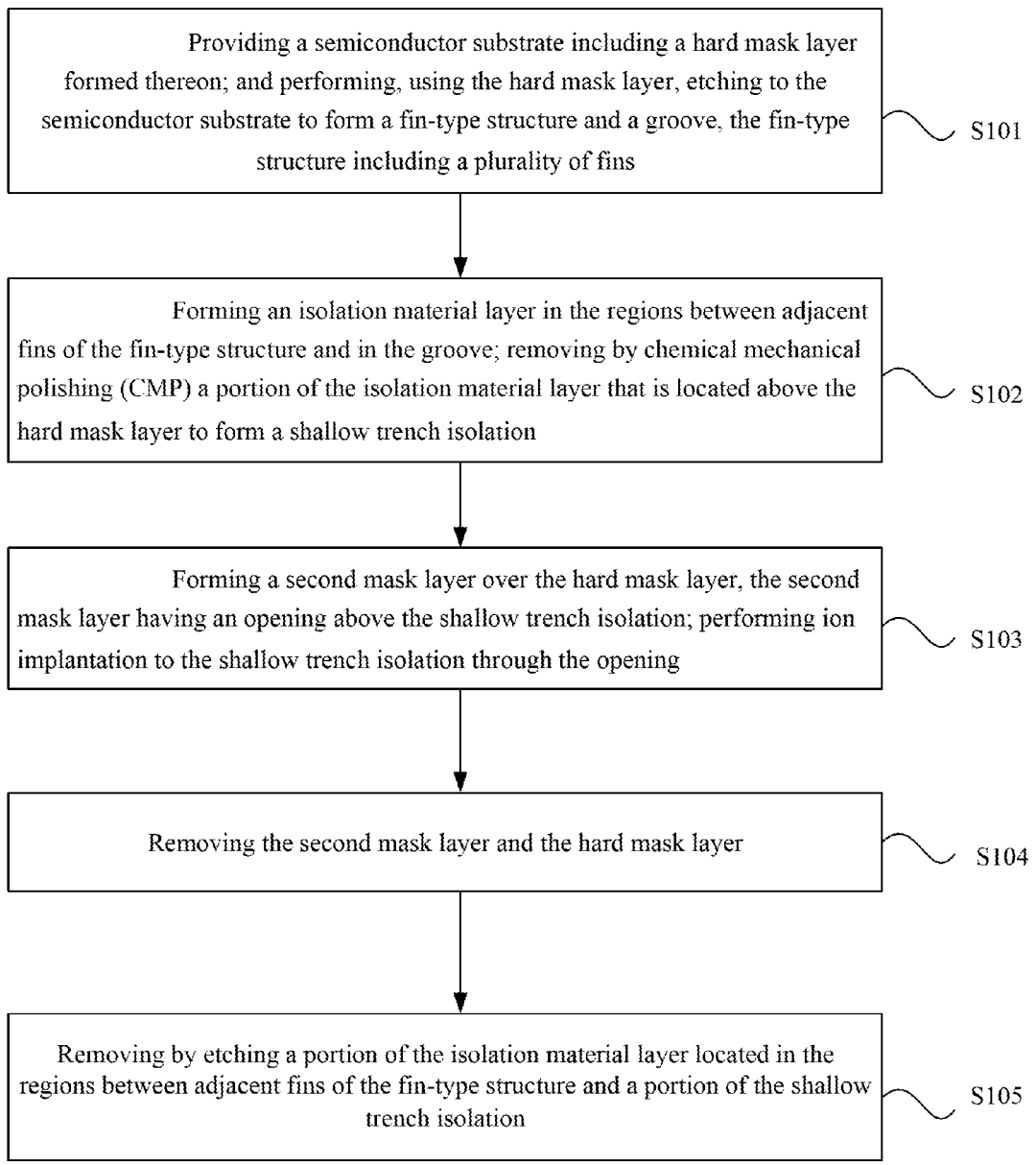
FIG. 2 is a simplified flowchart illustrating a method of forming a semiconductor device according to an embodiment of the present invention.

The method further includes, at step A2, forming a liner material layer 1020, and forming an isolation material layer 1030 on the liner material layer 1020, as shown in FIG. 1B.

The isolation material layer 1030 fills the groove 1002 and the regions between adjacent fins in the fin structure 1001.

According to an embodiment, the material for the liner material layer 1020 may include silicon oxide, silicon nitride, or other suitable material. The method of forming the liner material layer 1020 may include deposition or other suitable method. The materials for the isolation material layer 1030 may include silicon oxide or other suitable material. The method of forming the isolation material layer 1030 may include fluid chemical vapor deposition (FCVD) or other suitable method.

In some embodiments, only the isolation material layer 1030 is formed; and the liner material layer 1020 is not formed.

Figure 1C:
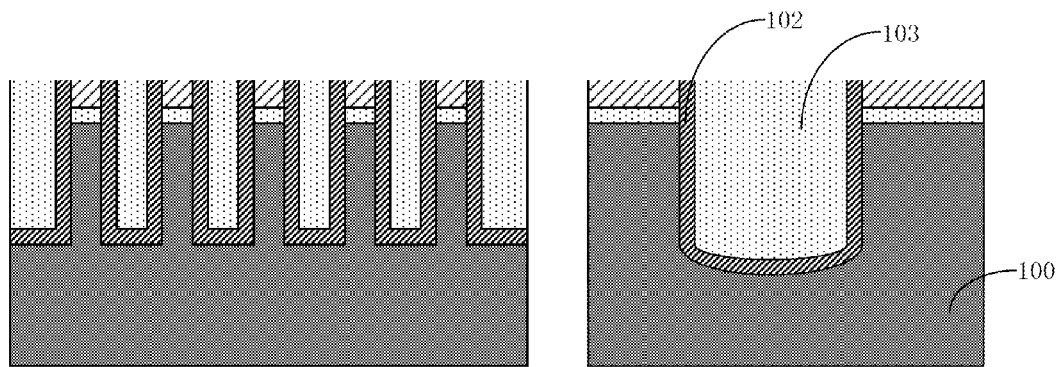

The method further includes, at step A3, removing a portion of the isolation material layer 1030 and a portion of the liner material layer 1020 that are located above the hard mask layer 200 by using chemical mechanical polishing (CMP), thereby forming a liner layer 102 and a shallow trench isolation (STI) 103, as shown in FIG. 1C.

In step A3, a portion of the hard mask layer 200 may also be removed. In an embodiment, the hard mask layer 200 has a three-layer structure that includes, from top to bottom, a first silicon oxide layer, a silicon nitride layer, and a second silicon oxide layer. In this step, the first silicon oxide layer is removed.

The shallow trench isolation 103 is located in an area near the fin-type structure where subsequent etching is performed to form the recesses (the fin cut area) as described below.

Figure 1D:
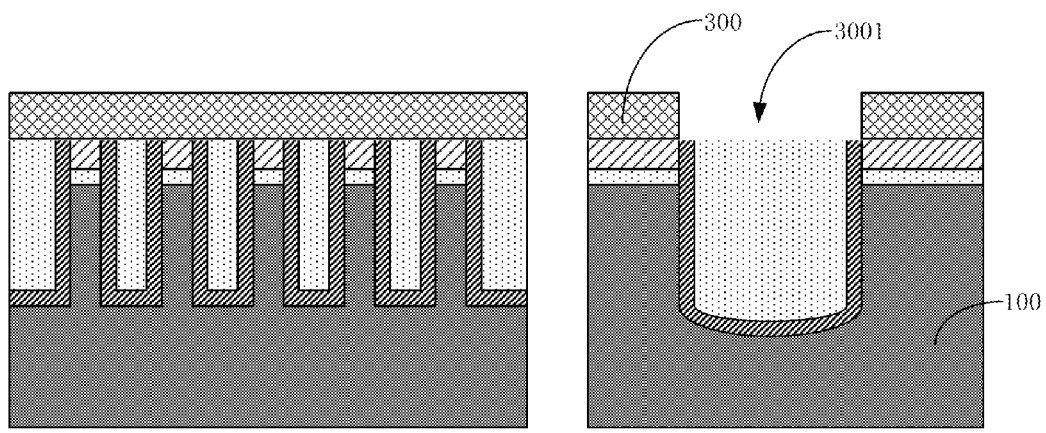

The method further includes, at step A4, forming a second mask layer 300 on the hard mask layer 200. The mask layer 300 includes an opening 3001 above the shallow trench isolation 103, as shown in FIG. 1D.

According to an embodiments, the material for the second mask layer 300 may include a photoresist material or other suitable materials. In an embodiment, the method of forming the second mask layer 300 may include: depositing a photoresist layer, and exposing and developing the photoresist layer.

Figure 1E:
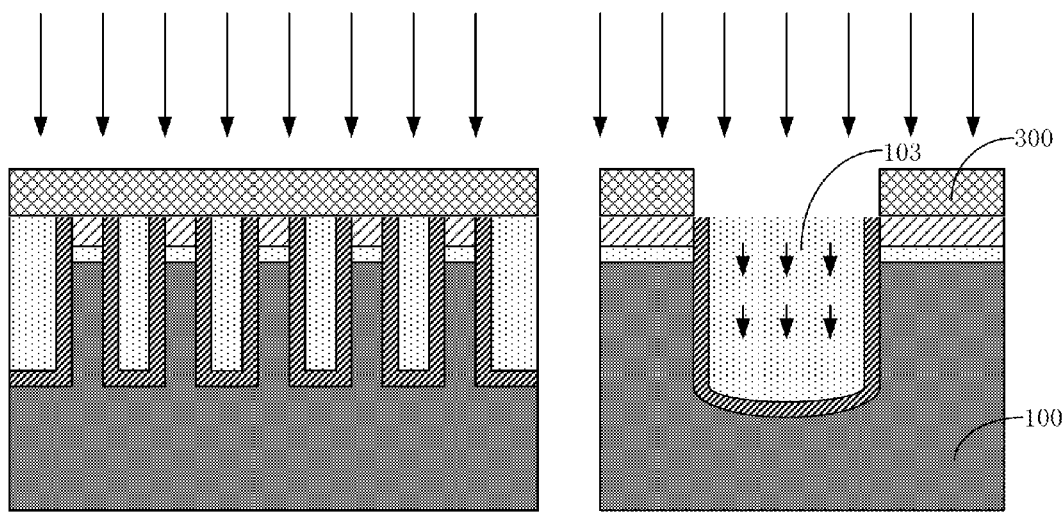

The method further includes, at step A5, performing ion implantation to the shallow trench isolation 103 through the opening 3001 to reduce the etch rate of the shallow trench isolation 103, as shown in FIG. 1E.

According to an embodiment, the implantation ions include carbon ions or other suitable ions.

The ion implantation in the shallow trench isolation 103 may reduce the etch rate to the shallow trench isolation 103 during the subsequent etching to remove a portion of the isolation material layer 1030 in the regions between adjacent fins of the fin-type structure 1001, thereby reducing the loss of the shallow trench isolation 103 in that process.

According to an embodiment, the ion implantation uses vertical injection. That is, the injecting direction is substantially perpendicular to the upper surface of the semiconductor substrate 100. In FIG. 1E, the long arrows indicate the direction of the ion injection; the short arrows indicate the implanted ions in the shallow trench isolation 103.

Figure 1F:
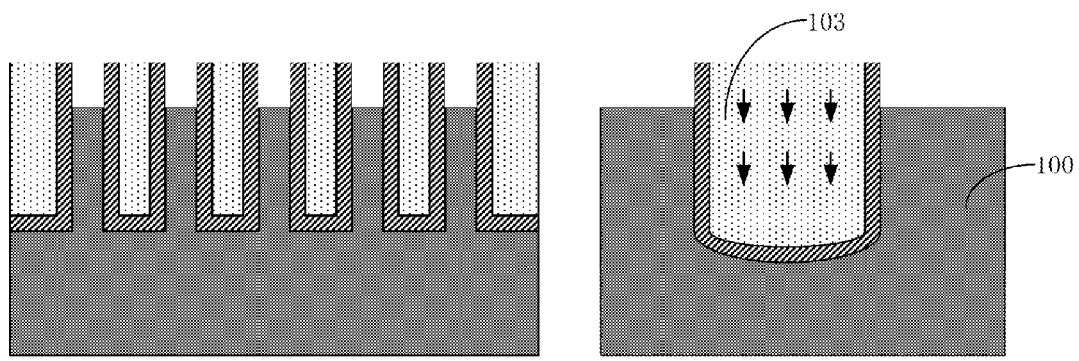

The method further includes, at step A6, removing the second mask layer 300 and the hard mask layer 200, as shown in FIG. 1F.

The method of removing the second mask layer 300 and the hard mask layer 200 may include a lift-off process or other suitable process.

Figure 1G:
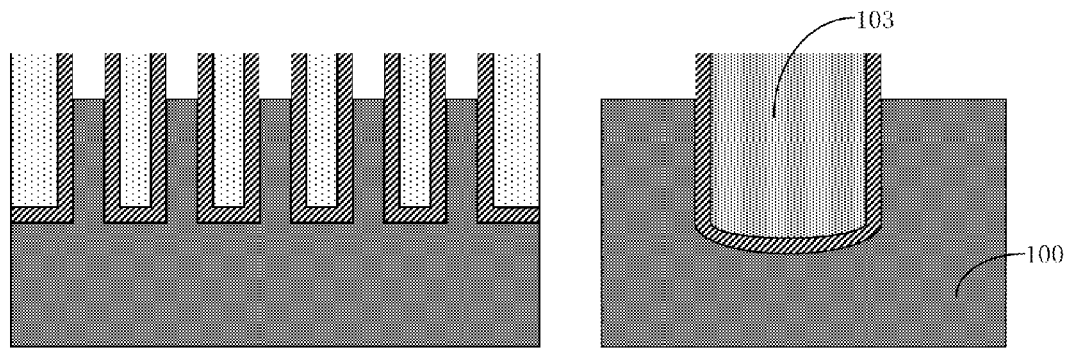

The method further includes, at step A7, annealing the shallow trench isolation 103, as shown in FIG. 1G.

While the shallow trench isolation 103 is annealed, the distribution of the implanted ions (e.g., carbon ions) may be adjusted in the shallow trench isolation 103, thereby further adjusting the etch rate of the shallow trench isolation 103. In the present embodiment, by performing ion implantation (step A5) and annealing (step A7) to the shallow trench isolation 103, the etch rate to the shallow trench isolation 103 can be reduced in the subsequent etching to remove the portion of the isolation material layer 1030 located in the regions between adjacent fins of the fin-type structure 1001. That is, by improving the etching selectivity, the improper etching of the shallow trench isolation 103 during the subsequent etching is reduced, thereby improving the performance and reliability of the resulting semiconductor device.

According to an embodiment, the annealing treatment is applied to the entire semiconductor substrate 100 and the members located thereon (e.g., the shallow trench isolation 103). The annealing method may include rapid thermal annealing, laser annealing, etc.

Figure 1H:
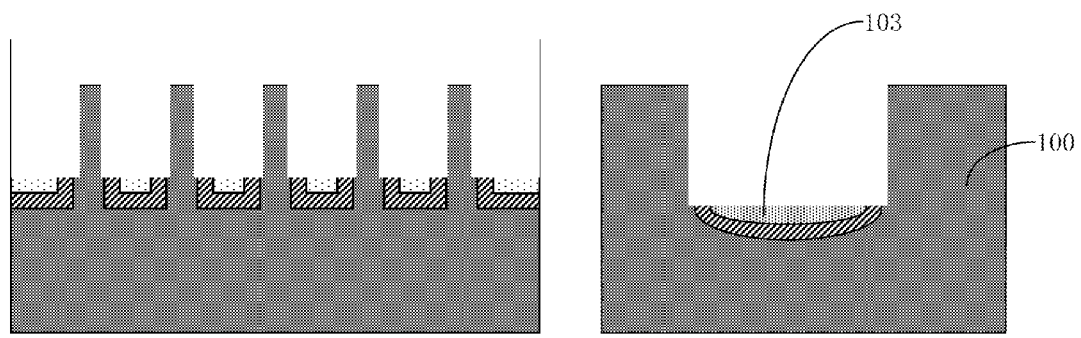

The method further includes, at step A8, by using etching, removing the portion of the dielectric layer (the isolation material layer 1030) located in the regions between adjacent fins of the fin-type structure 1001 and a portion of the shallow trench isolation 103, as shown in FIG. 1H. The portion of the shallow trench isolation 103 that is removed has a thickness that is less than the height of the shallow trench isolation 103. Through step A8, recesses are formed in the regions between adjacent fins of the fin-type structure 1001.

According to embodiments of the present invention, the etching method may include dry etching, wet etching or other suitable etching methods. In an embodiment that includes a liner layer 102 (the liner material layer 1020), the portion of the liner material layer 1020 located in the regions between adjacent fins of the fin-type structure 1001 and the portion of the liner layer 102 located on the sides of the shallow trench isolation 103 are also etched.

In step A8, the shallow trench isolation 103 is not subjected to excessive etching. As shown in FIG. 1H, after etching, the remaining portion of the dielectric layer located in the regions between adjacent fins of the fin-type structure 1001 and the remaining portion of the shallow trench isolation 103 have substantially the same height. Whereas in the prior art, the shallow trench isolation 103 is often subjected to excessive etching. As a result, the height of the remaining portion of the shallow trench isolation 103 is typically less than the height of the remaining portion of the dielectric layer located in the regions between adjacent fins of the fin-type structure 1001.

This completes the description of the steps of the method of forming a semiconductor device according to an embodiment of the present invention. Those skilled in the art will appreciate that, in addition to the above-mentioned steps A1 to A8, the method may include additional steps between the steps A1 to A8, or after step A8.

The method of forming a semiconductor device according to an embodiment of the present invention includes performing ion implantation to the shallow trench isolation to reduce the etch rate of the shallow trench isolation, thereby reducing the loss of the shallow trench isolation 103 during the subsequent etching to the portion of the isolation material layer located in the regions between adjacent fins of the fin-type structure, thus, improving the performance and reliability of the resulting semiconductor device.

FIG. 2 is a simplified flowchart illustrating a method of forming a semiconductor device according to an embodiment of the present invention.

The method includes, at step S101, providing a semiconductor substrate. The semiconductor substrate includes a hard mask layer formed thereon. Step S101 further includes, by using a hard mask layer, etching the semiconductor substrate to form a fin-type structure and a groove for receiving a shallow trench isolation. The fin-type structure includes a plurality of fins.

The method further includes, at step S102, forming an isolation material layer in the regions between adjacent fins of the fin-type structure and in the groove, and removing by CMP a portion of the isolation material layer that is located above the hard mask layer to form a shallow trench isolation.

The method further includes, at step S103, forming a second mask layer over the hard mask layer, the second mask layer having an opening above the shallow trench isolation, and performing ion implantation to the shallow trench isolation through the opening to reduce an etch rate in the shallow trench isolation.

The method further includes, at step S104, removing the second mask layer and the hard mask layer.

The method further includes, at step S105, removing by etching a portion of the isolation material layer located in the regions between adjacent fins of the fin-type structure and a portion of the shallow trench isolation.

Second Embodiment

In another embodiment of the present invention, an electronic apparatus is provided. The electronic apparatus includes a semiconductor device and an electronic component assembly coupled to the semiconductor device. The semiconductor device includes a semiconductor device formed by the method described above. The electronic component assembly may include any suitable electronic components.

According to an embodiment, a method of forming the semiconductor device includes, at step S101, providing a semiconductor substrate. The semiconductor substrate includes a hard mask layer formed thereon. Step S101 further includes, by using a hard mask layer, etching the semiconductor substrate to form a fin-type structure and a groove for receiving a shallow trench isolation. The fin-type structure includes a plurality of fins.

The method further includes, at step S102, forming an isolation material layer in the regions between adjacent fins of the fin-type structure and in the groove, and removing by CMP a portion of the isolation material layer that is located above the hard mask layer to form a shallow trench isolation.

The method further includes, at step S103, forming a second mask layer over the hard mask layer, the second mask layer having an opening above the shallow trench isolation, and performing ion implantation to the shallow trench isolation through the opening to reduce an etch rate in the shallow trench isolation.

The method further includes, at step S104, removing the second mask layer and the hard mask layer.

The method further includes, at step S105, removing by etching a portion of the isolation material layer located in the regions between adjacent fins of the fin-type structure and a portion of the shallow trench isolation.

In an embodiment, the method further includes, after step S104 and before step 105, at step S1045, performing annealing to the shallow trench isolation.

In an embodiment, in step S103, the implantation ions include carbon ions. In an embodiment, the injecting direction of the ion implantation is substantially perpendicular to the upper surface of the semiconductor substrate.

The electronic apparatus may be a mobile phone, tablet PCs, laptops, netbooks, game consoles, TV receiver, VCD player, DVD player, GPS, camera, video camera, voice recorder, MP3, MP4, PSP players, or any other electronic products or equipment. It can also be an intermediate product having the above semiconductor device, for example: a mobile phone motherboard and the like.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method of fabricating a semiconductor device, the method comprising:
   providing a semiconductor substrate including a hard mask layer formed thereon;
   performing, using the hard mask layer as a mask, etching to the semiconductor substrate to form a fin-type structure and a groove, the fin-type structure including a plurality of fins;
   forming an isolation material layer in the regions between adjacent fins of the fin-type structure and in the groove;
   removing by chemical mechanical polishing (CMP) a portion of the isolation material layer that is located above the hard mask layer to form a shallow trench isolation;
   forming a second mask layer over the hard mask layer, the second mask layer having an opening above the shallow trench isolation;
   performing ion implantation to the shallow trench isolation through the opening;
   removing the second mask layer and the hard mask layer; and
   removing by etching a portion of the isolation material layer located in the regions between adjacent fins of the fin-type structure and a portion of the shallow trench isolation.

2. The method of claim 1, further comprising: after removing the second mask layer and the hard mask layer, and before removing a portion of the isolation material layer located in the regions between adjacent fins of the fin-type structure and a portion of the shallow trench isolation, performing annealing to the shallow trench isolation.

3. The method of claim 1, wherein performing ion implantation uses carbon ions.

4. The method of claim 1, wherein an injecting direction of the ion implantation is substantially perpendicular to an upper surface of the semiconductor substrate.

5. The method of claim 1, wherein the hard mask layer comprises a first silicon oxide layer, a silicon nitride layer, and a second silicon oxide layer.

6. The method of claim 1, further comprising: before forming the isolation material layer, forming a liner material layer, and wherein removing by CMP a portion of the isolation material layer that is located above the hard mask layer comprises removing by CMP a portion of the liner material layer that is located above the hard mask layer.

7. The method of claim 1, wherein performing etching to the semiconductor substrate to form a fin-type structure and a groove uses a self-aligned double patterning technique.

8. The method of claim 1, wherein the isolation material layer comprises silicon oxide, and the isolation material layer is formed by fluid chemical vapor deposition.

9. The method of claim 1, wherein the second mask layer comprises a photoresist layer.

* * * * *